(12) United States Patent
Bishop et al.

(10) Patent No.: US 8,342,884 B2
(45) Date of Patent: ***Jan. 1, 2013

(54) DUAL CARD EDGE CONNECTOR WITH TOP-LOADING MALE AND FEMALE COMPONENTS

(75) Inventors: Peter Bishop, Cambs (GB); Norman Huntley, Herts (GB)

(73) Assignee: AVX Corporation, Fountain Inn, SC (US)

( * ) Notice: Subject to any disclaimer, the term of this patent is extended or adjusted under 35 U.S.C. 154(b) by 206 days.

This patent is subject to a terminal disclaimer.

(21) Appl. No.: 12/820,608

(22) Filed: Jun. 22, 2010

(65) Prior Publication Data

US 2011/0019398 A1    Jan. 27, 2011

Related U.S. Application Data

(60) Provisional application No. 61/228,795, filed on Jul. 27, 2009.

(51) Int. Cl.
*H01R 13/66* (2006.01)
(52) U.S. Cl. ............................... 439/620.06; 362/249.02
(58) Field of Classification Search ............. 439/620.06, 439/59, 285, 290, 893; 362/217.08, 260, 362/222, 249.02
See application file for complete search history.

(56) References Cited

U.S. PATENT DOCUMENTS

| | | | |
|---|---|---|---|
| 5,176,530 A * | 1/1993 | Reylek et al. ................. | 439/290 |
| 6,050,845 A | 4/2000 | Smalley, Jr. et al. | |
| 6,962,511 B2 | 11/2005 | Gutierrez et al. | |
| 7,021,946 B2 | 4/2006 | Koizumi et al. | |
| 7,090,529 B1 | 8/2006 | Wang | |
| 7,377,669 B2 | 5/2008 | Farmer et al. | |
| 7,441,922 B2 * | 10/2008 | Huang et al. .................. | 362/235 |
| 7,585,187 B2 | 9/2009 | Daily et al. | |
| 7,621,752 B2 | 11/2009 | Lin et al. | |
| 2003/0112627 A1 | 6/2003 | Deese | |
| 2005/0007033 A1 | 1/2005 | Kan et al. | |
| 2005/0068770 A1 | 3/2005 | Sloan et al. | |
| 2005/0265051 A1 | 12/2005 | Yamamoto et al. | |
| 2007/0223225 A1 | 9/2007 | Eiich et al. | |
| 2008/0094837 A1 | 4/2008 | Dobbins et al. | |
| 2008/0298058 A1 | 12/2008 | Kan et al. | |
| 2010/0053956 A1 | 3/2010 | Park et al. | |

(Continued)

FOREIGN PATENT DOCUMENTS

EP           1 901 406         3/2008

(Continued)

OTHER PUBLICATIONS

AVX "New Product Update" Screen Shots.

(Continued)

*Primary Examiner* — Vanessa Girardi
(74) *Attorney, Agent, or Firm* — Dority & Manning, P.A.

(57) ABSTRACT

An LED light assembly includes a plurality of LED printed circuit boards (PCB), with each LED PCB having at least one LED bulb and electrical connector pads configured at each opposite end of the boards. A top loading two-component surface mount electrical connector is configured to connect one end of a first LED PCB to an end of a second said LED PCB such that the first and second LED PCBs are electrically connected in an abutting end-to-end configuration. The connected LED PCBs may be configured in a light tube that includes connector end caps for mounting the light tube in a light fixture.

19 Claims, 6 Drawing Sheets

U.S. PATENT DOCUMENTS

2010/0142204 A1* 6/2010 Bishop ............... 362/249.02
2010/0142205 A1* 6/2010 Bishop ............... 362/249.02

FOREIGN PATENT DOCUMENTS

| | | |
|---|---|---|
| GB | 2467027 | 7/2010 |
| GB | 2467820 | 8/2010 |
| WO | WO 2008/114992 A1 | 9/2008 |
| WO | WO 2009/064014 | 5/2009 |

OTHER PUBLICATIONS

UK Search Report, Nov. 19, 2010.

* cited by examiner

DUAL CARD EDGE CONNECTOR WITH TOP-LOADING MALE AND FEMALE COMPONENTS

PRIORITY CLAIM

The present application claims priority to U.S. Provisional Application Ser. No. 61/228,795, filed Jul. 27, 2009.

BACKGROUND

The use of LED (Light Emitting Diode) lights is becoming increasingly popular in a wide variety of lighting applications. Significant advances have been made in LED lighting technology, which have made the use of LED lights more affordable and desirable in various industrial, household, and other environments requiring expanded lighting systems.

LED lights offer significant advantages over traditional incandescent lighting systems. With incandescent bulbs, the expense is not only the cost of replacement bulbs, but the labor and costs associated with frequent replacement of the bulbs. This expense can be significant where there are a large number of installed bulbs. For example, the maintenance costs to replace bulbs in large office buildings, public transportation vehicles and systems, and the like, can be quite high. These issues are substantially minimized with LED lighting systems.

The operational life of conventional white LED lamps is about 100,000 hours. This equates to about 11 years of continuous operation, or 22 years of 50% operation. This is in stark contrast to the average life of an incandescent bulb, which is approximately 5000 hours. It is thus readily appreciated that the use of LED lights virtually eliminates the need for routine bulb replacement. This advantage is even more important when the lighting device is embedded into a very inaccessible place.

It is generally recognized that, in a properly designed system, LED lights consume significantly less power than incandescent bulbs. An LED circuit has an efficiency of about 80%, which means 80% of the electrical energy is converted to light energy while the remaining 20% is lost as heat energy. In large lighting systems, the cost savings are enormous.

Unfortunately, due in part to the relatively high cost of LED lights, the art turned to fluorescent light bulbs and systems as an alternative to incandescent lights. Fluorescent lighting is about 66 percent cheaper than incandescent lighting while providing essentially the same brightness. Fluorescent lighting also lasts longer than conventional incandescent lighting. On average, a fluorescent tube has a lifespan six times longer than a regular incandescent bulb. A vast majority of commercial and industrial structures incorporate conventional fluorescent tube lighting fixtures, as do more recent residential structures. Fluorescent lighting fixtures are also used widely in public transportation systems and vehicles, trains, subway cars, planes, and so forth.

Fluorescent lights, however, have distinct disadvantages. Fluorescent lighting circuits are more complex than incandescent lighting and generally requires professional installation and expensive components. Fluorescent lighting is generally less attractive than incandescent lighting and can flicker noticeably and produce an uneven light that may bother some users. Mercury is an essential component in the manufacturing of fluorescent light tubes, and is considered hazardous by the U.S. Environmental Protection Agency due to its ability to bioaccumulate within the environment. The disposal of fluorescent light tubes is problematic for many municipalities, and a movement is underway in many locations to phase out the use of fluorescent lighting.

Increased reliance on LED lighting is thus a natural progression. However, the costs of replacing the existing fluorescent light tube fixtures and circuitry in existing structures, vehicles, systems, and so forth, is cost prohibitive. There is thus a need for a lighting system that can easily and affordably incorporate LED light devices in conventional fluorescent light fixtures. The present invention offers a unique connector solution to this need.

SUMMARY OF THE INVENTION

Objects and advantages of the invention will be set forth in part in the following description, or may be obvious from the description, or may be learned through practice of the invention.

In accordance with aspects of the invention, an electrical connector is provided that is particularly well suited for connecting electrical component boards, such as printed circuit boards (PCB) (particularly LED PCB boards), together in an abutting end-to-end configuration. The connector will be described herein with reference to LED board assemblies for sake of convenience and illustrative purposes only. It should, however, be appreciated that connectors according to the invention are not limited to use with LED boards or in LED fixtures, but may used in any application wherein a secure electrical connection is desired between adjacent board components in an abutting end-to-end configuration.

In accordance with certain aspects of the invention, an LED light assembly is provided that includes a plurality of light emitting diode (LED) printed circuit boards (PCB) (referred to herein as an "LED board"), each of which has at least one LED bulb and electrical connector pads configured at each opposite end of the LED board. A two-component surface mount electrical connector is disposed to electrically connect one end of a first LED board to an end of a second adjacent LED board in an abutting end-to-end configuration such that there is no space between the adjacent ends of the boards.

The two-component surface mount connector between the adjacent LED boards can take on various configurations in accordance with the invention. In a particularly unique embodiment, the connector includes a male component mounted at an end of a first LED board, and a female component mounted at the abutting end of a second LED board. The female component includes a socket having an open top configured for receipt of the male component in a top loading process such that electrical connection is made between the first and second LED boards without relative longitudinal movement between the LED boards. This configuration is particularly useful in that the LED boards can be inserted into and removed from a light fixture or other component simply by displacing the boards in a vertical or transverse direction relative to the longitudinal axis of the aligned group of boards. A single board can be inserted or placed into the grouping without having to disconnect the other boards or disassemble the fixture. This configuration will save considerable time and expense in the ongoing maintenance of LED light fixtures or components utilizing a plurality of LED boards.

In a particular embodiment, the female component includes an insulative body that defines the open top socket. At least two electrical contacts are held in the insulative body, with each of the electrical contacts having a first section at a bottom surface of the insulative body. These first sections are spaced apart a distance corresponding to a connector pad footprint on the end of the LED board. The electrical contacts in the female component include a second section that extends into the open top socket.

The male component of the electrical connector includes an insulative base body with at least two electrical contacts that have a first section at a bottom surface of the insulative base body spaced apart a distance corresponding to a connector pad footprint on an end of an adjacent LED board. The male component further includes an insulative plug member that extends transversely from the base body beyond the end of the LED board. The electrical contacts in the male component have a second section that extends at least partially onto the plug member. With this unique configuration of the female and male components, mating electrical contact is made between the components by inserting the plug member of the male component into the open top socket of the female component from above in a top loading process such that the electrical contacts on the plug member engage against the electrical contacts in the open top socket. The top loading process does not require relative longitudinal movement between the LED boards to engage the connector components.

It should be appreciated that the connector components may be mounted onto the respective LED boards utilizing any conventional surface mount technology. For example, the components may include surface mounting brackets configured at respective bottom surface thereof for a solder or mechanical attachment to the boards.

In a particular embodiment, the second sections of the electrical contacts in the open top socket of the female component are spring biased into engagement with the second sections of the electrical contacts on the male plug member. For example, the electrical contacts in the female component may be formed by a generally U-shaped strip member, with the biased second section defined by an upper leg of the U-shaped contact that extends into the open top socket. The first section of the electrical contact is defined by the opposite leg of the U-shaped contact that extends through an opening in the insulative body to the bottom surface of the insulative body.

In a further unique embodiment, the connector may include a top cover member configured on either one of the female component or the male component. The top cover member is movable from a first position wherein the open top socket in the female component is exposed for receipt of the plug member, to a second position wherein the cover member extends over and closes the open top socket so as to prevent inadvertent removal of the plug member from the open top socket. In a particular embodiment, the top cover member is slidable in a longitudinal direction on the body member of the female component.

The present invention also encompasses an LED light tube assembly that is configured for receipt in a lighting fixture. This light tube assembly includes a light tube having an end cap connector at each opposite longitudinal end thereof. In this manner, the LED light tube assembly may resemble a conventional fluorescent light tube. A plurality of LED boards are connected in an end-to-end abutting configuration within the light tube, with each of the LED boards having at least one LED bulb and electrical connector pads configured at each opposite end of the board. The electrical connector pads on the extreme opposite ends of the connected boards are in electrical mating contact with the end cap connectors. As described above, a two-component surface mount electrical connector connects the connector pads of aligned ends of adjacent LED boards within the light tube such that one end of a first LED board is in electrical contact to an end of a second LED board. In this manner, any desired number of LED boards can be connected in an end-to-end direct abutting manner within the light tube. Thus, various sizes and power ratings of the light tube can be easily manufactured and assembled using a standard, single size LED board, end cap connectors, and board connectors. Only the length of the light tube would vary to accommodate the desired number of LED boards.

The LED light tube assembly is particularly unique in that it can be readily configured for receipt in an existing fluorescent light fixture. The end cap connectors would include pin contacts configured for receipt in receptacles in the fluorescent light fixture. Thus, the LED light tube can be a replacement bulb for existing fluorescent light fixtures.

The invention also encompasses an electrical connector configured for connecting adjacent ends of PCBs, such as LED boards within a light tube, in an abutting end-to-end configuration. This connector may have the unique configuration and advantages as described above, and is presented in greater detail herein.

Aspects of the invention are presented below by reference to particular embodiments illustrated in the figures.

DETAILED DESCRIPTION

Reference will now be made in detail embodiments of the invention, examples of which are illustrated in the drawings. The various embodiments are presented herein for sake of explaining aspects of the invention, and should not be interpreted as a limitation of the invention. For example, features illustrated or described with respect to one embodiment can be used with another embodiment to yield still a further embodiment. It is intended that the present invention include these and other modifications and variations as come within the scope and spirit of the invention.

Figure 1:
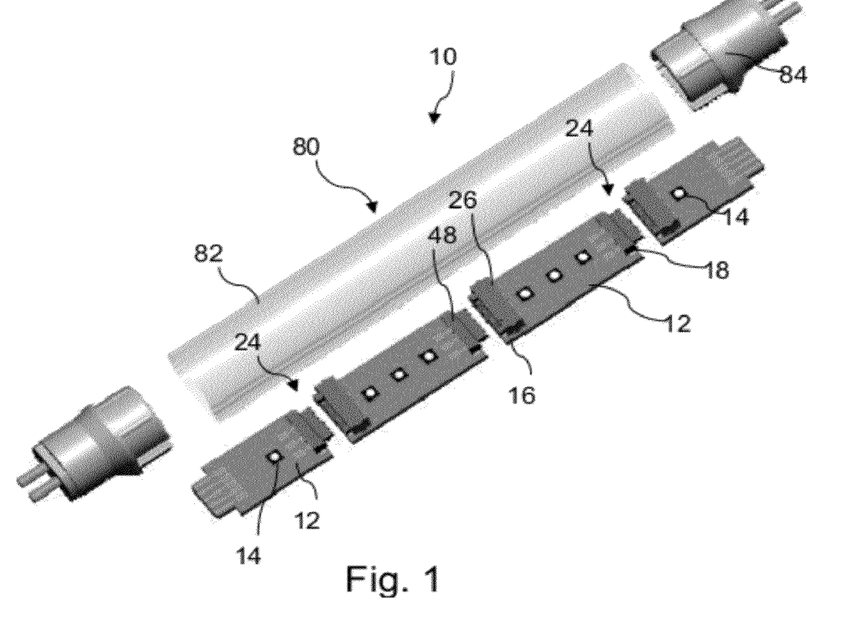
FIG. 1 is a component view of an embodiment of an LED light tube assembly.
Figure 2:
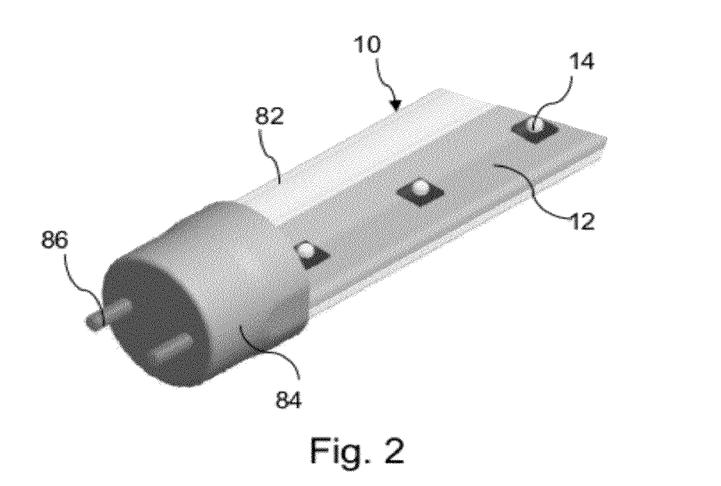
FIG. 2 is a partial assembled view of the LED light tube assembly of FIG. 1.

FIGS. 1 and 2 illustrate a unique embodiment incorporating aspects of the invention. An LED light assembly 10 is illustrated in FIG. 1. This assembly 10 includes a plurality of individual LED printed circuit boards (PCB) 12. Each of these boards 12 includes at least one LED bulb 14. In the illustrated embodiment, each board 12 includes four bulbs 14. The boards 12 may be manufactured so as to have a standard length, number of bulbs, and other standard dimensions. In this manner, a manufacturer need not manufacture and stock different size LED PCBs 12, which is a significant cost and manufacturing advantage.

Figure 8:
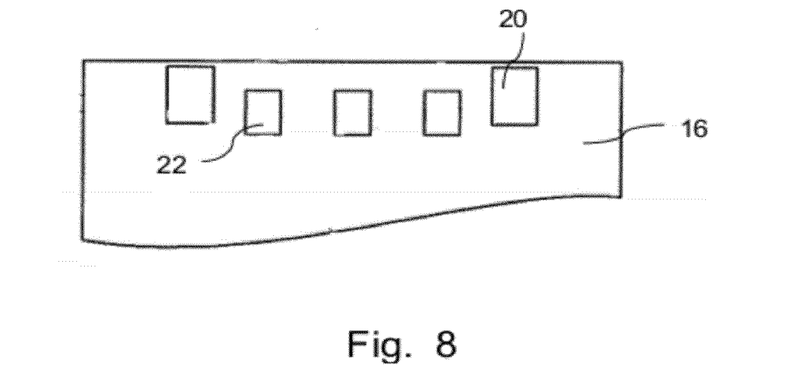
FIG. 8 is a view of a contact footprint on an end of a PCB.

Each of the boards 12 includes a first end 16 and an opposite second 18. Each of the ends 16, 18 includes a connector pad footprint that incorporates a number of connector pads 22 (FIG. 8) and surface mount bracket pads 20 (FIG. 8). The pads 22, 20 serve to electrically connect and supply electric power to the bulbs 14 mounted on the board 12.

A more detailed view of an end 16 of a board 12 is given in FIG. 8. In this view, three individual connector pads 22 are shown between surface mount pads 20. These pads may be made of any conventional and suitable conductive material. For example, in a particular embodiment, the pads may be tin plated members.

Figure 3A:
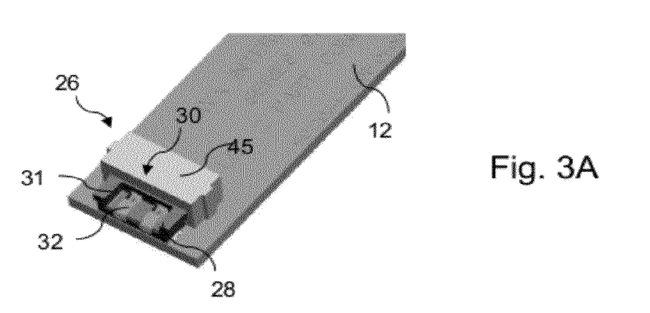
FIG. 3A is a perspective view of an embodiment of a female component of a two-part surface mount electrical connector for a PCB assembly in accordance with aspects of the invention.
Figure 3B:
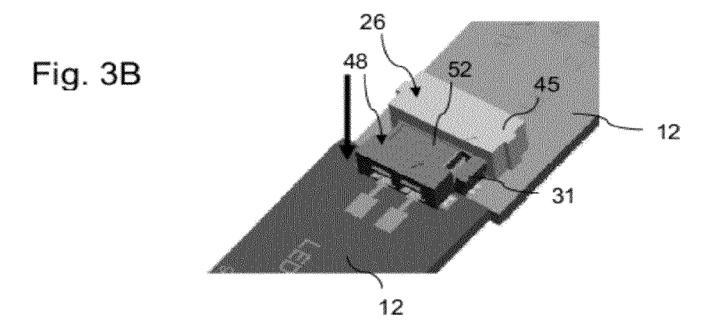
FIG. 3B is a perspective view of an embodiment of a two-part connector illustrating a male component engaging in the female component of FIG. 3A in a top loading process.

Referring again to FIG. 1, a two-part surface mount connector 24 is provided between adjacent LED PCBs 12. The components of this connector 24 can take on various configurations, and serve to interconnect adjacent boards 12 in a direct abutting end-to-end configuration. In the embodiment of the connector 24 illustrated in the figures, a female component 26 is mounted at a first end 18 of an LED PCB 12 on the top surface thereof, and is in electrical contact with connector pads 22 (FIG. 8) on the top surface of the board 12. A separate male component 48 is mounted at the opposite end of the LED PCB 12 on the top surface thereof, and is in electrical contact with connector pads 22 on that end of the board 12. Mounting of the female component 26 and male component 48 on opposite ends of a board 12 is particularly illustrated in FIGS. 3A, 3B, and 3C. With this unique two-part component connector 24, the male component 48 of a first board 12 is inserted from above into an open top socket 30 in the female component 26 of a second board 12, as indicated by the arrow in FIG. 3B, so as to electrically connect the first and second LED PCBs 12 in an abutting, end-to-end configuration. As can be appreciated from FIGS. 3A-3C, relative axial movement (along the longitudinal axis of the boards 12) is not necessary to engage the connector components. In other words, it is not necessary to slide one component into the other along the axis of the boards 12.

Referring particularly to FIGS. 4A-4D, the female component 26 of the connector 24 includes an insulative body 28 having an internal open top socket 30 defined therein, for example between side walls 31. The insulative body 28 can take on various shapes and sizes, and is generally formed of any suitable insulative material, such as nylon-46. Other insulative materials are well known to those skilled in the art and may be used in the components of a connector 24 of the present invention.

At least two electrical contacts 32 are held in the body 28 of the female component 26. Any number of contacts 32 may be configured in the body 28 depending on the desired contact footprint (i.e., a 2-way, 3-way, 4-way contact, and so forth).

Each of the contacts 32 has a first section 34 disposed at a bottom surface 38 of the body 28 that engages against the contact pads 22 on the board 12. The first sections 34 are spaced along the bottom surface 38 at a distance and pattern corresponding to a separation distance and pattern of the corresponding connector pads 22 (FIG. 8) at the respective end of the LED PCB 12.

Figure 4A:
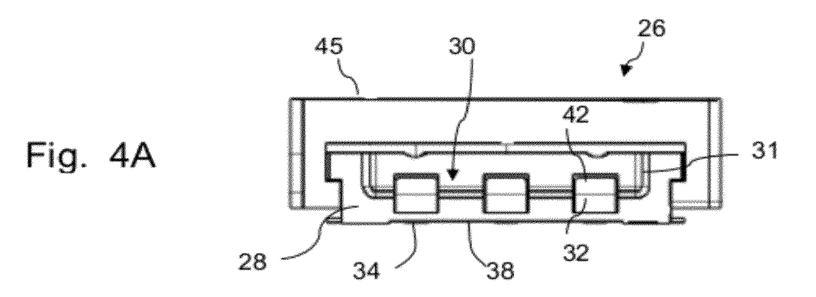
FIG. 4A is a front end view of an embodiment of a female component of a particular embodiment of a connector in accordance with the invention.
Figure 4B:
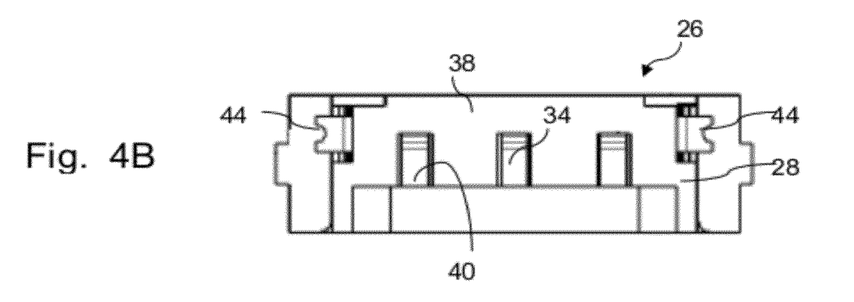
FIG. 4B a bottom view of the embodiment of the female component illustrated in FIG. 4A.
Figure 4C:
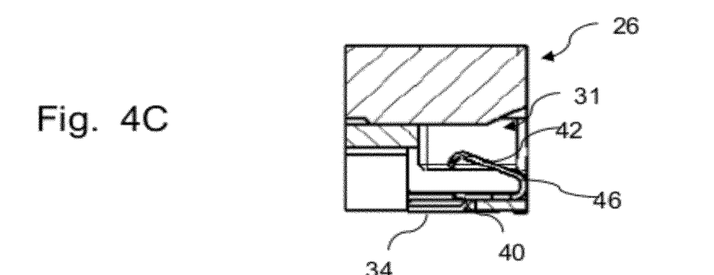
FIG. 4C is a cut-away side view of the female component of FIG. 4A.
Figure 4D:
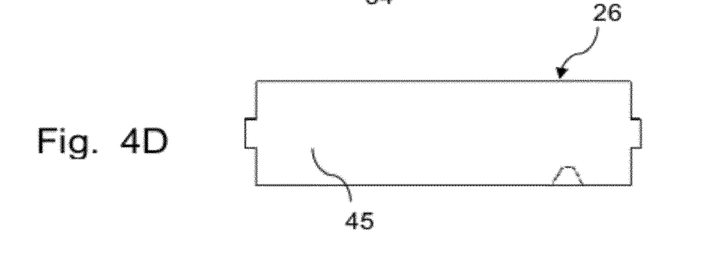
FIG. 4D is a top view of the female component of FIG. 4A.
Figure 5A:
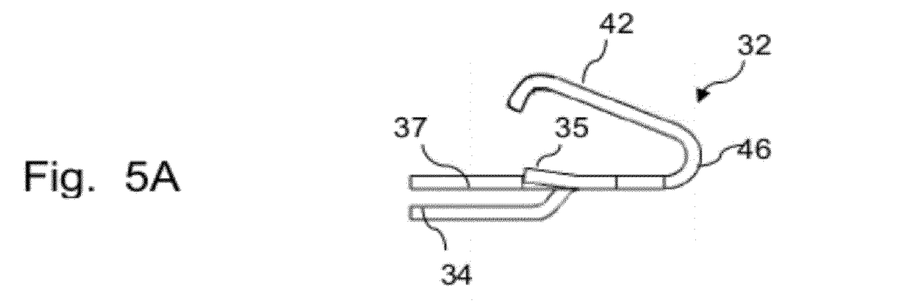
FIG. 5A is a side view of an embodiment of an electrical contact for a female component of a connector.
Figure 5B:
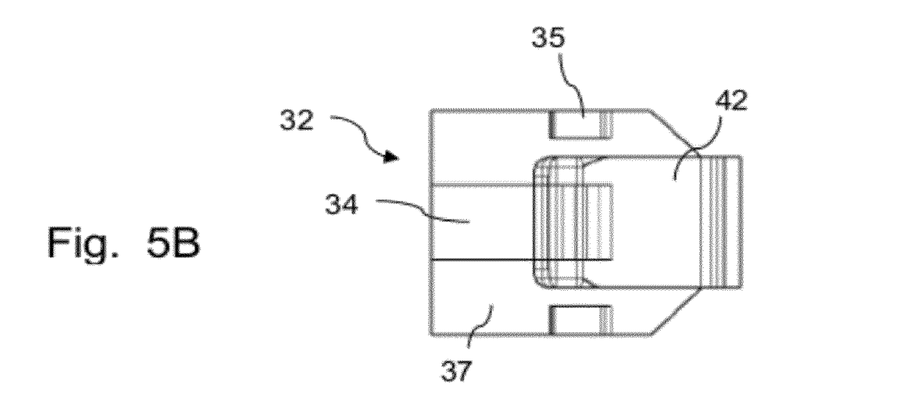
FIG. 5B is a top view of the contact of FIG. 5A.
Figure 5C:
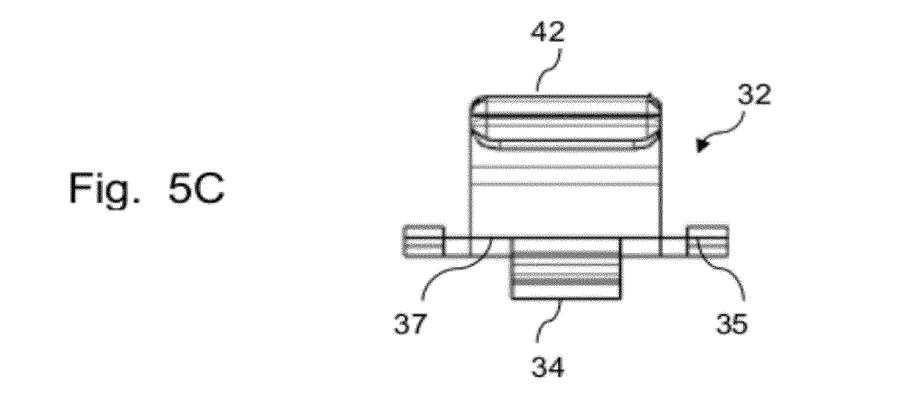
FIG. 5C is a front end view of the contact of FIG. 5A.

Contacts 32 in the female component 26 may include a second section 42 that extends into the open top socket 30, as particularly illustrated in FIG. 4A. This section 42 may be spring biased into the socket 30 as the result of a bend 46 in the contact 32. An embodiment of a contact 32 is illustrated in FIGS. 5a-5C. The contact 32 is a generally U-shaped strip member with the first section 34 of the contact 32 being defined between legs 37 in the lower section of the U-shaped member. The first section 34 extends through an opening or slot 40 (FIGS. 4B, 4C) in the body 28 near the bottom surface 38 of the body. The other leg of the U-shaped contact 32 is defined by the bend 46 and extends into the open top socket 30, with the bend 46 imparting a degree of spring or resiliency to the second section 42. The U-shaped contact 32 may bend around a post or portion of the body 28, or the contact 32 may be retained in slots or other engaging structure defined in any portion of the body 28. For example, any manner of spring arms 35, barbs, or other retaining features may be defined in the contacts 32 to aid in retaining the contact in a secure desired position in the body 28. It should be readily appreciated that any suitable means may be employed to retain the contacts 32 within the body 28. For example, the contacts 32 may be molded into the body 28, or retained by any mechanical means.

Figure 6A:
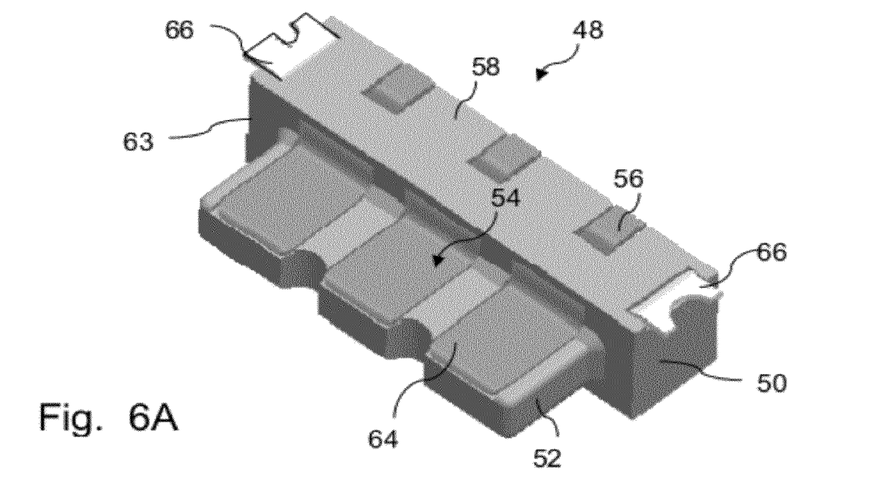
FIG. 6A is a perspective view of an embodiment of a male component of an electrical connector in accordance with aspects of the invention.
Figure 6B:
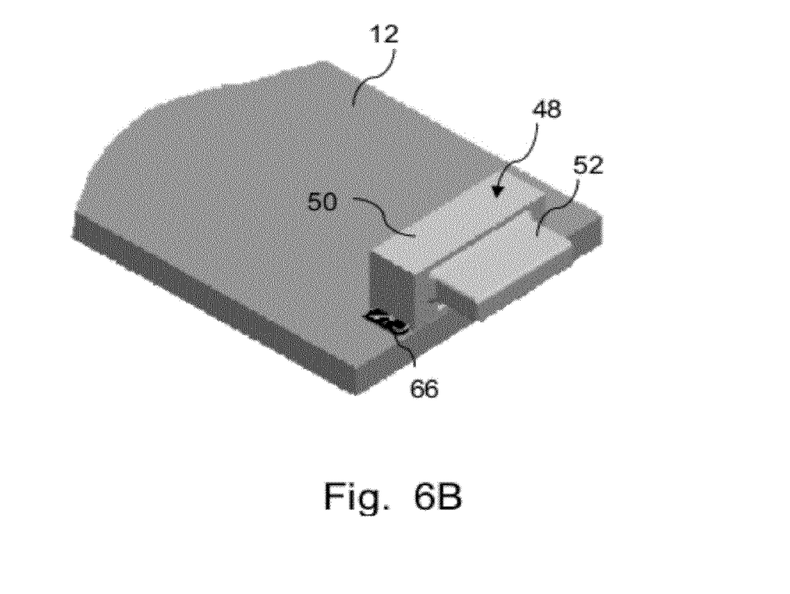
FIG. 6B is a perspective view of a PCB having the male component of FIG. 6A mounted at an end thereof.
Figure 7A:
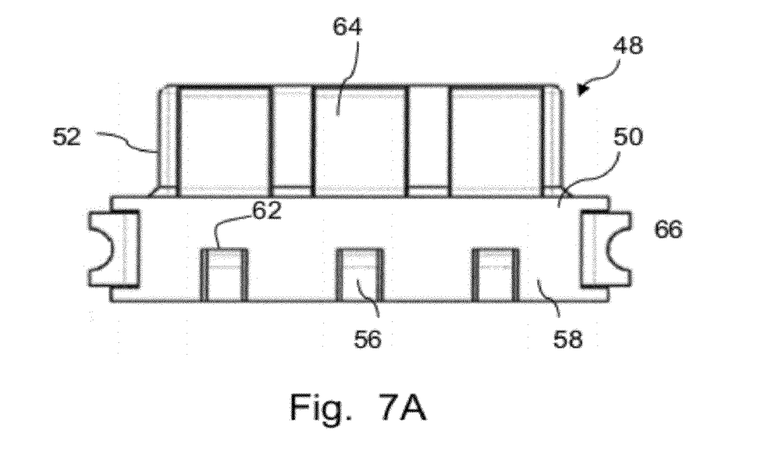
FIG. 7A is a bottom view of an embodiment of a male component of an electrical connector in accordance with aspects of the invention.
Figure 7B:
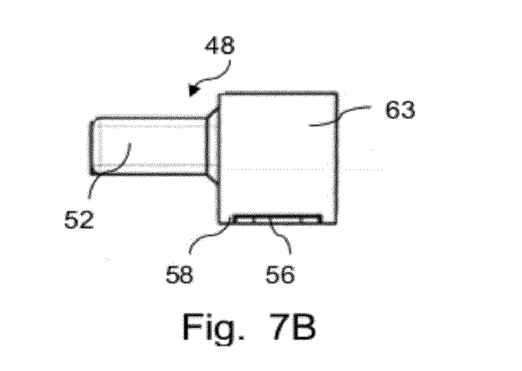
FIG. 7B is a side view of the male component of FIG. 7A.

An exemplary embodiment of a male component 48 is illustrated in FIGS. 6A, 6B, 7A, and 7B. The component 48 may include an insulative base body 50 having at least two electrical contacts 54 retained thereby. The contacts 54 may have a first section 56 disposed at a bottom surface 58 of the body and spaced apart a distance corresponding to a separation distance and pattern of corresponding connector pads 22 (FIG. 8) at the second end of the LED PCB 12, as particularly illustrated in FIGS. 6A and 7A. The male component 48 includes a plug member 52 that extends transversely from the base body 50 beyond the end of the LED PCB 12, which relationship is particularly illustrated in FIG. 6B. The electrical contacts 54 in the male component 48 have a second section 64 that extends at least partially onto the plug member 52, as illustrated in FIGS. 6A and 7A. For example, the electrical contacts 54 may extend through an opening in a side wall 63 of the base body 50 generally at a location where the plug member 52 extends transversely from the side wall 63. A portion of the contact 54 defining the first section 56 may extend out of an opening 62 in the bottom 58 of the body 50, as seen in FIG. 7A. Thus, the contacts 54 may include any number of bends to accommodate this configuration within the body 50 and along the plug member 52. As with the female components 26, the contacts 54 may be retained in the plug component 48 by any suitable means. For example, the contacts 54 may be molded directly into the plug component 48, or retained by any suitable mechanical means.

Referring again to FIGS. 3A-3C, it is readily appreciated that for mating electrical connection between adjacent LED PCBs 12, the plug member 52 extending transversely from a male component 48 on one end of a first board 12 is pushed vertically into the open top socket 30 in the female component 26 mounted to the end of an adjacent board 12. The second section 64 of the contacts 54 exposed on the plug member 52 along the bottom surface of the plug member engage in pressing contact with the biased second sections 42 of the contacts 32 in the socket 30, which face upward in the socket 30.

The female 26 and male 48 components may be retained on the top surface of the LED PCBs 12 by any suitable surface mount technology. For example, in the illustrated embodiments, the female component 26 includes surface mount brackets 44, and the male component 48 includes surface mount brackets 66, for mounting onto contact pads 20 (FIG. 8) on the PCB 12, by soldering or any other conventional means known or practiced in the art.

In a particularly unique embodiment, the connector 24 may include a top cover member configured on either one of the female component or the male component. In the illustrated embodiment, a top cover member 45 is movable from a first position (illustrated in FIG. 3A) wherein the open top socket 30 in the female component 26 is exposed for receipt of the plug member 52 (FIG. 3B), to a second position wherein the cover member 45 extends over and closes the open top socket 30 (FIG. 3C) so as to prevent inadvertent removal of the plug member 52 from the socket 30. In the illustrated embodiment, the top cover member 45 is slidable in a longitudinal direction on the body member of the female component. It should be appreciated that the cover member 45 may also be provided on the male component 48.

It should be readily appreciated that the two-part connector 24 described herein is not limited in any way to a particular construction material. In a desirable embodiment, the various contacts may be, for example, copper alloy with selective gold over nickel tin plated on the contact tails. The surface mount brackets may be, for example, a tin plated copper alloy. The insulative body components may be, for example, nylon-46.

Figure 3C:
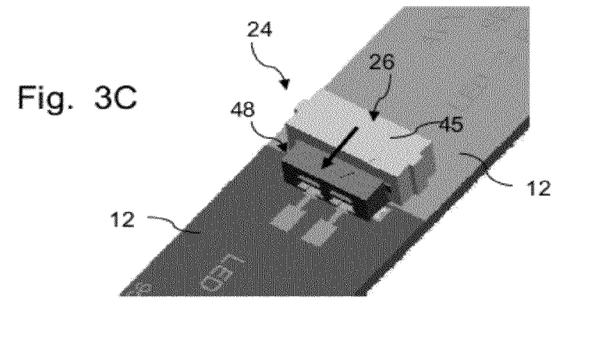
FIG. 3C is an assembled component view of the embodiment of the two-part connector illustrated in FIG. 3B.

Referring particularly to FIG. 3C, it can be seen that the electrical connector 24 between the adjacent LED PCBs 12 allows for zero spacing between the boards. In other words, the boards 12 abut in a direct contacting, end-to-end configuration. This may be an important consideration when space within a fight tube or other type of LED fixture is limited. Also, the distance between LED bulbs 14 is uniform along the length of the connected boards 12 since the connector 24 does not add additional space between the boards 12.

The present invention also encompasses an LED light tube assembly 80, as particularly illustrated in FIGS. 1 and 2. This assembly 80 includes a light tube 82 that may be, for example, glass, plastic, or any other type of suitable clear or translucent material. The assembly 80 includes an end cap connector 84 at opposite ends of the tube 82. Each of these connectors 84 includes any manner of external electrical connection component, such as pins 86. These pins 86 engage into a power supply socket in a conventional light fixture, such as any manner of conventional fluorescent light fixture. A plurality of LED PCBs 12 are connected in an end-to-end configuration within the light tube 82, as conceptually illustrated in FIG. 1 wherein three boards 12 are illustrated. Connector pads 22 on the extreme ends of the connected boards 12 engage in a corresponding socket or other connector component within the end cap connectors 84. Thus, in this manner, a complete electrical circuit is defined from one end cap connector 84, through the interconnected boards 12, and to the opposite end cap connector 84.

Referring again to FIG. 1, it should be appreciated that various sizes and power ratings for a light tube assembly 80 can be easily manufactured and assembled using a standard size LED PCB, end cap connectors 84, and surface mount board connectors 24. Only the length of the light tube 82 would need to vary to accommodate an increased or decreased number of LED PCBs 12. The light tube assembly 80 particularly illustrated in FIG. 1 is unique in that it resembles a conventional fluorescent light bulb and can be readily configured for receipt in an existing fluorescent light fixture. Thus, the LED light tube assembly 80 can act as a replacement bulb for existing fluorescent light fixtures.

It should also be readily appreciated that the invention also encompasses a two-part surface mount electrical connector 24 configured for connecting adjacent ends of any manner of PCBs 12, and is not limited to use with LED boards or LED fixtures. The connectors 24 may be used in any application wherein a secure electrical connection is desired between adjacent board components in an abutting end-to-end configuration.

It should be readily appreciated by those skilled in the art that various modifications and variations can be made to the present invention without departing from the scope and spirit of the invention as set forth in the claims and their equivalents.

What is claimed is:

1. An LED light assembly, comprising:
   a plurality of LED boards, each said LED board having at least one LED bulb and electrical connector pads configured at each opposite end of said LED boards on a top surface of said LED boards;
   at least one electrical connector connecting one end of a first LED board to an end of a second said LED board such that said first and second LED boards are electrically connected in an abutting end-to-end configuration, said electrical connector comprising a male component surface mounted onto said top surface of said LED board at said end of said first LED board and a female component surface mounted onto said top surface of said LED board at the abutting said end of said second LED board, said female component comprising an open top socket configured for receipt of said male component in a top loading process such that electrical connection is made between said first and second LED boards without relative longitudinal movement between said LED boards.

2. The LED light assembly as in claim 1, wherein:
   said female component comprises an insulative body defining said open top socket, and at least two electrical contacts held in said insulative body, said electrical contacts having a first section at a bottom surface of said insulative body spaced apart a distance corresponding to a connector pad footprint on said end of said LED board, and a second section that extends into said open top socket; and
   said male component comprises an insulative base body with at least two electrical contacts that have a first section at a bottom surface of said insulative base body spaced apart a distance corresponding to a connector pad footprint on said end of said LED board;
   said male component further comprising an insulative plug member that extends transversely from said base body beyond said end of said LED board, said electrical contacts having a second section that extends at least partially onto said plug member; and
   wherein in mating contact of said plug member in said open top socket, said plug member is pushed into said open top socket from above such that said electrical contacts on said plug member engage against said electrical contacts in said open top socket.

3. The LED light assembly as in claim 1, wherein said female component and said male component further comprise surface mounting brackets configured at a respective bottom surface thereof.

4. An LED light assembly, comprising:
a plurality of LED boards, each said LED board having at least one LED bulb and electrical connector pads configured at each opposite end of said LED boards on a top surface of said LED boards;
at least one electrical connector connecting one end of a first LED board to an end of a second said LED board such that said first and second LED boards are electrically connected in an abutting end-to-end configuration, said electrical connector comprising a male component mounted at said end of said first LED board and a female component mounted at the abutting said end of said second LED board, said female component comprising an open top socket configured for receipt of said male component in a top loading process such that electrical connection is made between said first and second LED boards without relative longitudinal movement between said LED boards;
said female component comprising an insulative body defining said open top socket, and at least two electrical contacts held in said insulative body, said electrical contacts having a section that extends into said open top socket;
said male component comprising an insulative base body with at least two electrical contacts, said male component further comprising an insulative plug member that extends transversely from said base body beyond said end of said LED board, said electrical contacts having a section that extends at least partially onto said plug member;
wherein in mating contact of said plug member in said open top socket, said plug member is pushed into said open top socket from above such that said electrical contacts on said plug member engage against said electrical contacts in said open top socket; and
wherein said sections of said electrical contacts in said open top socket are spring biased into engagement with said sections of said electrical contacts of said male plug member.

5. The LED light assembly as in claim 4, wherein said electrical contacts in said female component are generally U-shaped, said biased section defined by an upper leg of said U-shaped contact that extends into said open top socket, and a different section of said electrical contact defined by a leg of said U-shaped contact that extends through an opening in said insulative body to said bottom surface of said insulative body.

6. An LED light assembly, comprising:
a plurality of LED boards, each said LED board having at least one LED bulb and electrical connector pads configured at each opposite end of said LED boards on a top surface of said LED boards;
at least one electrical connector connecting one end of a first LED board to an end of a second said LED board such that said first and second LED boards are electrically connected in an abutting end-to-end configuration, said electrical connector comprising a male component mounted at said end of said first LED board and a female component mounted at the abutting said end of said second LED board, said female component comprising an open top socket configured for receipt of said male component in a top loading process such that electrical connection is made between said first and second LED boards without relative longitudinal movement between said LED boards; and
further comprising a top cover member configured on one of said female component or said male component, said top cover member movable from a first position wherein said open top socket is exposed for receipt of said plug member to a second position wherein said open top socket is covered so as to prevent removal of said plug member from said open top socket.

7. The LED light assembly as in claim 6, wherein said top cover member is slidable in a longitudinal direction on said body member of said female component.

8. An LED light tube assembly configured for receipt in a lighting fixture, comprising:
a light tube having an end cap connector at each opposite longitudinal end thereof
a plurality of LED printed circuit boards (PCB) connected in an abutting end-to-end configuration within said light tube, each said LED PCB having at least one LED bulb and electrical connector pads configured at each opposite end of said LED PCBs on a top surface of LED PCBs, said electrical connector pads of said extreme opposite ends of said connected LED PCBs in electrical mating contact with said end cap connectors; and
at least one electrical connector connecting one end of a first LED PCB to an end of a second adjacent said LED PCB such that said first and second LED PCBs are electrically connected in an abutting end-to-end configuration, said electrical connector comprising a two-component surface mount configuration wherein a male component engages into a female component in a top loading process without relative longitudinal movement between said LED PCBs; and
said female component comprising an insulative body defining an open top socket, and at least two electrical contacts held in said insulative body with a section that is spring biased into said open top socket;
said male component comprising an insulative base body with a plug member that extends transversely from said base body beyond said end of said LED board, and electrical contacts having a section that extend at least partially onto said plug member;
wherein in mating contact of said plug member in said open top socket, said plug member is pushed into said open top socket from above such that said electrical contacts on said plug member engage against said spring biased contact section.

9. The LED light tube assembly as in claim 8, wherein said assembly is configured for receipt in a fluorescent light fixture, said end cap connectors comprising pin contacts configured for receipt in receptacles in said fluorescent light fixture.

10. The LED light tube assembly as in claim 8, wherein said LED PCBs have a standard uniform length, and whereby assemblies of varying length and power are configured by connecting more or less of said LED PCBs within said light tube.

11. The LED light tube assembly as in claim 8, wherein said female component and said male component further comprise surface mounting brackets configured at a respective bottom surface thereof.

12. The LED light tube assembly as in claim 8, wherein said electrical contacts in said female component are generally U-shaped, said biased section defined by an upper leg of said U-shaped contact that extends into said open top socket, and another section of said electrical contact defined by a leg of said U-shaped contact that extends through an opening in said insulative body to a bottom surface of said insulative body.

13. The LED light tube assembly as in claim 8, further comprising a top cover member configured on one of said female component or said male component, said top cover member movable from a first position wherein said open top socket is exposed for receipt of said plug member to a second position wherein said open top socket is covered so as to prevent removal of said plug member from said open top socket.

14. The LED light tube assembly as in claim 13, wherein said top cover member is slidable in a longitudinal direction on said body member of said female component.

15. A two-component surface mount electrical connector configured for connecting adjacent ends of PCBs in a component assembly in a top loading process without relative longitudinal movement between said PCBs, said connector comprising:
   a female component comprising an insulative body with a bottom surface configured for surface mounting onto an upper planar surface of a PCB, said insulative body further defining an open top socket, and at least two electrical contacts held in said insulative body with a first section at said bottom surface of said insulative body spaced apart a distance corresponding to a connector pad footprint on an end of a first said PCB, and a second section that extends into said open top socket; and
   said male component comprising an insulative base body with a bottom surface configured for surface mounting onto said upper planar surface of said PCB, and with at least two electrical contacts that have a first section at said bottom surface of said insulative base body spaced apart a distance corresponding to a connector pad footprint on said end of a second said PCB;
   said male component further comprising an insulative plug member that extends transversely from said base body beyond said end of said PCB, said electrical contacts having a second section that extends at least partially onto said plug member; and
   wherein in mating contact of said plug member in said open top socket, said plug member is pushed into said open top socket from above in a top loading process such that said electrical contacts on said plug member engage against said electrical contacts in said open top socket.

16. The connector as in claim 15, wherein said second sections of said electrical contacts in said open top socket are spring biased into engagement with said second sections of said electrical contacts of said male plug member.

17. The connector as in claim 15, wherein said electrical contacts in said female component are generally U-shaped, said biased second section defined by an upper leg of said U-shaped contact that extends into said open top socket, and said first section of said electrical contact defined by a leg of said U-shaped contact that extends through an opening in said insulative body to said bottom surface of said insulative body.

18. The connector as in claim 15, further comprising a top cover member configured on one of said female component or said male component, said top cover member movable from a first position wherein said open top socket is exposed for receipt of said plug member to a second position wherein said open top socket is covered so as to prevent removal of said plug member from said open top socket.

19. The connector as in claim 18, wherein said top cover member is slidable in a longitudinal direction on said body member of said female component.

* * * * *